United States Patent [19]

Kenmotsu et al.

[11] Patent Number: 4,902,394

[45] Date of Patent: Feb. 20, 1990

[54] SPUTTERING METHOD AND APPARATUS

[75] Inventors: Akihiro Kenmotsu, Fujisawa; Shigeru Kobayashi, Setagaya; Kunihiko Watanabe, Yokohama; Eiji Matsuzaki, Yokohama; Yoshifumi Yoritomi, Yokohama; Toshiyuki Koshita, Yokohama; Mitsuo Nakatani, Yokohama, all of Japan

[73] Assignee: Hitachi, Ltd., Tokyo, Japan

[21] Appl. No.: 146,031

[22] Filed: Jan. 20, 1988

[30] Foreign Application Priority Data

Jan. 23, 1987 [JP] Japan .................. 62-12343

[51] Int. Cl.⁴ ............................. C23C 14/34
[52] U.S. Cl. .................. 204/192.12; 204/298
[58] Field of Search .......... 204/192.12, 192.15, 204/298, 298 PS

[56] References Cited

U.S. PATENT DOCUMENTS

| | | | |
|---|---|---|---|
| 2,148,046 | 2/1939 | Burkhardt et al. | 204/192.12 |
| 3,860,507 | 1/1975 | Vossen, Jr. | 204/192.12 |
| 4,278,528 | 7/1981 | Kuehnle et al. | 204/192.12 X |
| 4,284,490 | 8/1981 | Weber | 204/192.12 X |
| 4,294,678 | 10/1981 | Kuehnle | 204/192.12 |
| 4,426,267 | 1/1984 | Munz et al. | 204/192.12 |
| 4,692,230 | 9/1987 | Nihei et al. | 204/192.12 X |

OTHER PUBLICATIONS

"Significant Features of Solder Connections to Gold-Plated Thin Films", by Keller, Electron Components Conf., vol. 32, pp. 346-353 1982.

"Internal Stresses and Resistivity of Low-Coltage Sputtered Tungsten Films", by Sun et al., Journal of Applied Physics, vol. 44, No. 3, Mar. 1973.

Primary Examiner—Nam X. Nguyen
Attorney, Agent, or Firm—Kenyon & Kenyon

[57] ABSTRACT

A sputtering method and apparatus for use in forming thin films on a substrate. The power output of a sputtering power source is periodically changed to a high level power and a low level power, and each film is deposited to a thickness corresponding to the integrated value of the high level power, whereby a desired thickness can be obtained in any of multilayer films having mutually different film thickness ratios.

11 Claims, 4 Drawing Sheets

FIG. 5
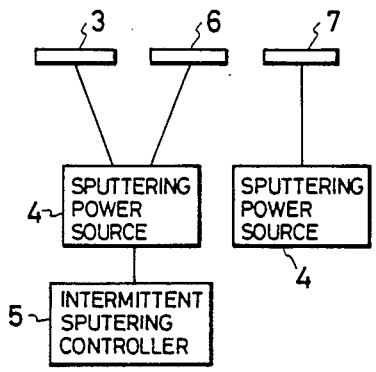
FIG. 6(a)
FIG. 6(b)
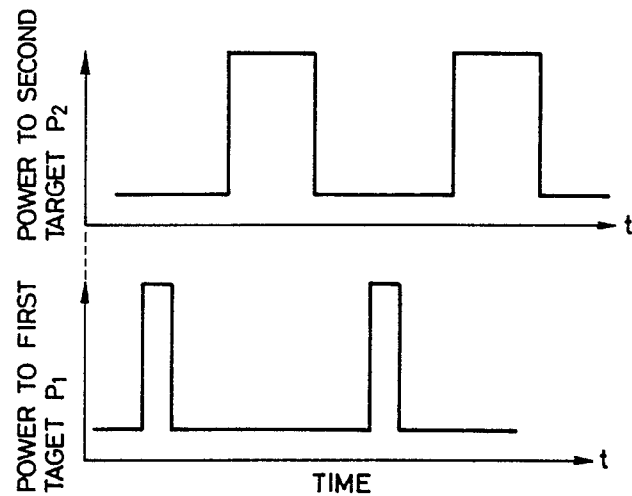
FIG. 7
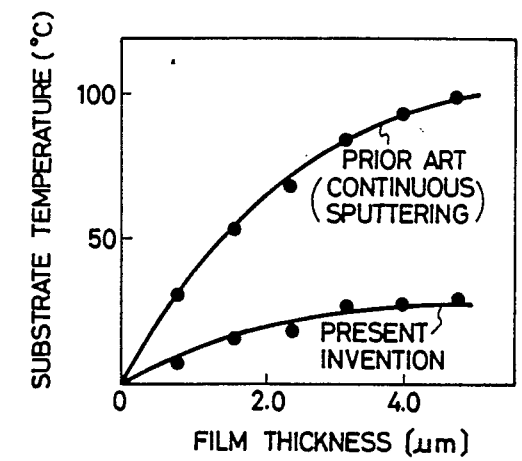

SPUTTERING METHOD AND APPARATUS

BACKGROUND OF THE INVENTION

1. Field of the Invention

The present invention relates to a method of forming thin films on a substrate and, more particularly, to a sputtering method and apparatus having high controllability with respect to both the thickness and the quality of such film.

2. Description of the Prior Art

In microelectronics products such as integrated circuits (ICs) and thin film devices, a plurality of thin films are shaped on a substrate to form superposed layers for enhancing the performance of circuits and achieving a higher density thereof in such a structure, the respective characteristics of the layered thin films are mutually different depending on the functions required for the individual films, so that there exist great differences among both the thicknesses and the qualities of the individual layered films. For instance, the film thickness difference reaches 10 to 100 times in some cases.

As an example using such multilayer thin films, there is known a technique of metallization for soldering use. In order to prevent dissolution of a metallizing coat against solder, it is necessary to provide a film thickness of several microns in metallization for soldering use. According to a cited reference "Electron Components Conf." (Vol. 32, pp. 346–353, 1982), an exemplary metallizing coat for soldering use has a composition of titanium Ti (approx. 3000Å) - palladium Pd (approx. 3000Å) - gold Au (5 μm). In this example, the films have wide differences among the respective thicknesses with the ratio thereof reaching about 20.

In application of such a metallizing coat to a thermal head or a TFT (Thin Film Transistor) active matrix substrate, sputtering is adapted to form a desired film due to the necessity of a large area. With regard to an in-linen sputtering apparatus, a conventional type is such that an intermittent sputtering controller 5 is removed from the apparatus illustrated in FIG. 1. In this apparatus, a Ti layer is formed by a first target, a Pd layer by a second target, and an Au layer by a third target, respectively. Since the movement speed is maintained constant due to the in-line system, the thickness ratio of the films formed on the substrate is determined by a combination of the target length L and the film forming speeds of the target materials.

The target length L is standardized, and varying the target size freely to change the film thickness ratio is not practically advantageous in the expensive sputtering apparatus, and therefore it is customary in actual manufacture to increase the film thickness ratio by arraying a plurality of targets of the length L. However, the allowable number of the targets to be arrayed is at most two or three since such an array brings about greater dimensions and higher cost of the sputtering apparatus.

Another technical factor relative to changing the film thickness ratio is a film forming speed. This speed is determined by the density of an electric power applied to the target and the sputter rate of the target material.

The sputter rates of the individual materials are Ti =0.5, Pd =2.0 and Au =2.5. For obtaining the aforementioned film thickness ratio 20 of Au to Pd, the power ratio applied to the targets needs to be set to 20. In this case, the required film thickness ratio cannot be achieved unless the sputtering power density applied to the target for the thinner film is set to an extremely small value of 1/5 to 1/50. Meanwhile, it is known that if the sputtering power density is so minimized as mentioned above, the film quality deteriorates and fails to attain the desired characteristics. For example, as disclosed in another cited reference "Journal of Applied Physics" (Vol. 44, No. 3, p. 1009, 1972), the particle size in the composition of the sputtered film is greatly dependent on the film forming speed. Such particle size needs to be well controlled since the etching characteristics and various properties relative to anticorrosion, antimigration, mutual diffusion and so forth are related to particle size. However, there has been a disadvantage heretofore that, if priority is given to the control of the film thickness as described, it becomes impossible to attain satisfactory control of the film quality.

Thus, in the prior art mentioned above, sufficient consideration is not given for ensuring adequate compatibility of the film thickness and the film quality. As a result the required quality or thickness of each film is unachievable.

SUMMARY OF THE INVENTION

It is an object of the present invention to provide a sputtering method and apparatus adapted to render the film thickness and the film quality compatible.

Another object of the present invention resides in providing a sputtering method and apparatus capable of forming multilayer films of different film thickness ratios by the use of standard-size targets and still ensuring the desired quality of each film.

And a further object of the present invention is to provide an economical sputtering method and apparatus capable of supplying required electric power to a multiplicity of targets by means of a single power source.

According to the present invention, the objects mentioned can be accomplished by intermittent control of the sputtering power, which is supplied to the targets of the sputtering apparatus, in such a manner as to periodically obtain a high level power and a low level power.

In the present invention, the high-level sputtering power is supplied through intermittent on-off switching action, so that the average film forming speed can be controlled in a range wider than that in the conventional apparatus. And, since the film quality is determined by the film forming speed at the intermittent on-time of the sputtering power, the same control range can still be maintained, with respect to the film quality also, as in the known art where the sputtering power is supplied continuously.

BRIEF DESCRIPTION OF THE DRAWINGS:

FIG. 5 illustrates the entire constitution of a second embodiment representing the intermittent sputtering apparatus of the present invention;

FIG. 6a and 6b show the waveform of an output power in the intermittent sputtering apparatus of FIG. 5;

FIG. 7 graphically shows a comparison of the substrate temperature rise in the intermittent sputtering of the present invention with that in the conventional continuous sputtering.

DESCRIPTION OF THE PREFERRED EMBODIMENTS

Hereinafter the present invention will be described in detail with reference to the accompanying drawings.

Figure 1:
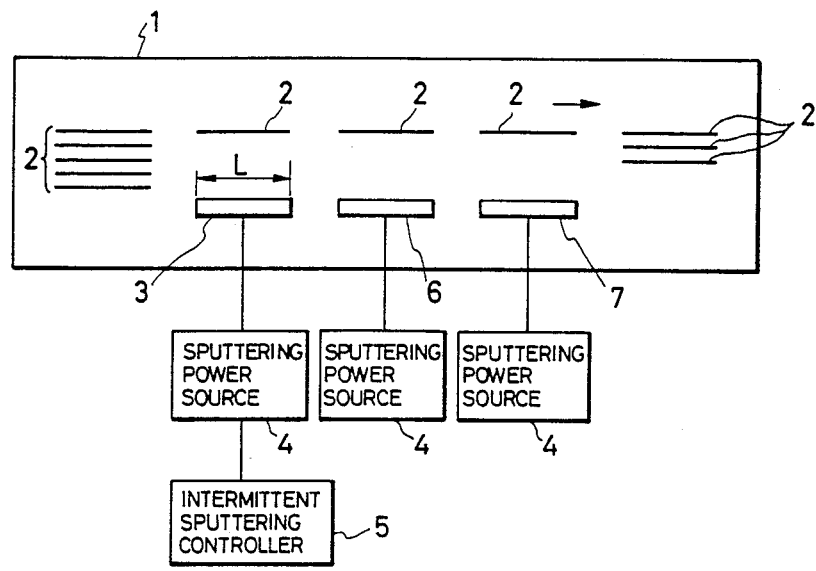
FIG. 1 illustrates the entire constitution of a first embodiment representing the intermittent sputtering apparatus of the present invention.

FIG. 1 shows a first embodiment of the invention. In a sputtering apparatus 1 designed to form multilayer films of titanium Ti (500Å) - palladium Pd (3000Å) - gold Au (1.5 μm), Ti is attached to a first target (electrode) 3, Pd to a second target (electrode) 6 and Au to a third target (electrode) 7 respectively, wherein the individual targets are dimensionally equal to one another. An intermittent sputtering controller 5 is connected to a sputtering power source 4 for the first target 3. In this example, a substrate 2 is transported at a fixed speed determined by the thickness of gold which is the greatest of all. Meanwhile a titanium film which is the thinnest of all and requires proper deposition to the substrate 2, needs to have a thickness of 500Å on the substrate 2 moved at the transport speed determined by gold. Therefore the intermittent sputtering controller 5 is employed here for the reason that reduction of the power density applied to the titanium electrode is not necessary.

It has been found that the films obtained as the result have satisfactory properties of adhesion as listed in Table 1 below.

TABLE 1

| Adhesion Strength of Ti—Pd—Au | |
|---|---|
| Method | Adhesion strength |
| Intermittent sputtering | 3 kg/mm² |
| Prior art (Ultralow-level power sputtering) | 1 kg/mm² |

Figure 2:
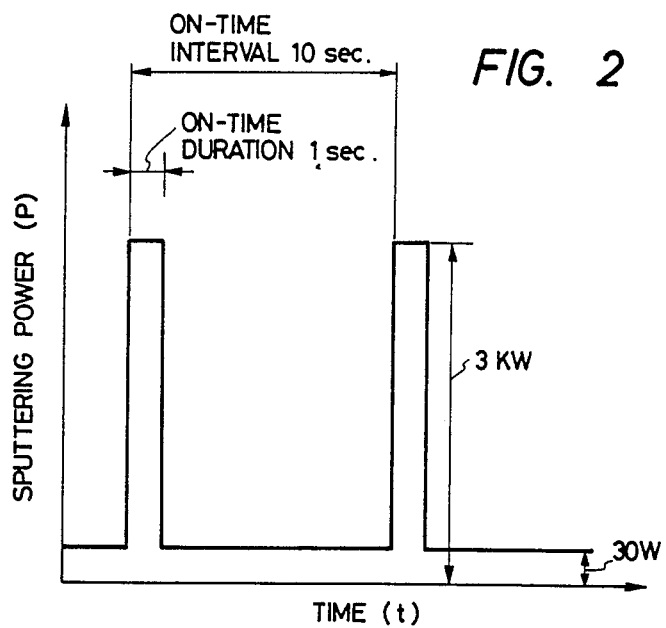
FIG. 2 shows the waveform of an output power in the intermittent sputtering apparatus of FIG. 1.

The intermittent sputtering controller 5 employed in this embodiment consists of a pulse generator which produces output pulses of the period shown in FIG. 2. And the output of the sputtering power source 4 is applied to the first target (electrode) 3 in response to such pulse output as shown in FIG. 2. In this stage, the sputtering power is changed in such a manner that an idle state is retained to maintain the predetermined minimum plasma even in a low-level power mode and, in a sputtering operation, the power is superimposed on the idle state. If such idle state is eliminated, there may occur a fault that required plasma fail to follow up despite application of the sputtering power.

Figure 3:
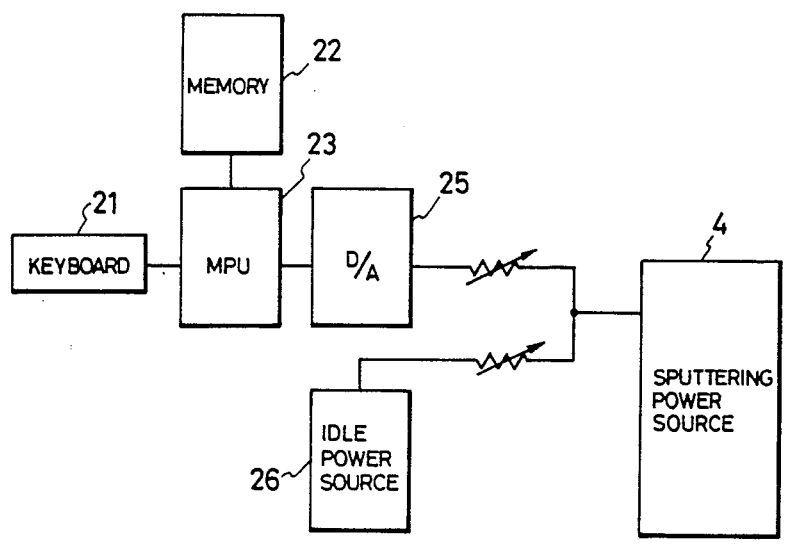
FIG. 3 is an exemplary block diagram of a sputtering controller.

Meanwhile, for obtaining the sputtering output of FIG. 2, the controller may be composed of a micro computer and so forth as shown in FIG. 3. In this example, an idle power is the output of an idle power source 26. And, a desired sputtering power can be produced by first the sputtering condition parameters of FIG. 4 as an input from a keyboard 21 to store the same in a memory 22 and then performing the necessary operation via a micro computer (MPU) 23 and a D-A converter 25. Although the idle power source is disposed separately in the example of FIG. 3, the idle power may also be an input from the keyboard 21 and may be an output the micro computer 23 and the D-A converter 25.

The interval of the intermittent sputtering on-time needs to be smaller than the quotient obtained through division of the target size by the substrate transport speed, or there may occur nonuniformity in the film thickness. Since such on-time interval is generally on the order of minutes, it is completely possible to use a mechanical switch such as a relay as a controller.

Figure 4:
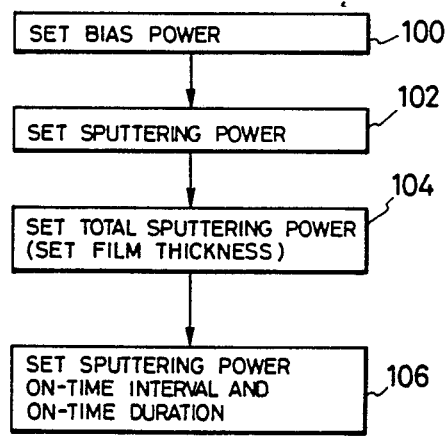
FIG. 4 is a flow chart of the procedure for setting the controller of FIG. 3.

Now the operation of supplying the sputtering condition parameters as inputs from the keyboard 21 will be described below with reference to FIGS. 2 and 4.

First a low-level bias power (e.g. 30W as shown in FIG. 2) is set (step 100 in FIG. 4), and then a high-level sputtering power (e.g. 3 kW) is set (step 102). Subsequently, a total sputtering power (integrated watt-hour or product of the sputtering power and the on-time duration) required for a desired film thickness is set, and a sputtering power on-time interval is set (steps 104 and 106 in FIG. 4).

Hereinafter a second embodiment of the invention will be described. FIG. 5 shows an exemplary constitution of a sputtering apparatus designed to form multilayer films of Ti-Pd-Au as in the first embodiment. Ti is attached to a first target (electrode) 3, Pd to a second target (electrode) 6 and Au to a third target (electrode) 7 respectively. As in the first embodiment, the substrate transport speed is determined by the thickness of gold. The sputtering power is allocated to the first and second targets (electrodes) 3 and 6 by an intermittent sputtering controller 5 as illustrated in FIG. 5. Due to such power allocation, one power source can be saved in comparison with the first embodiment of FIG. 1, whereby the sputtering apparatus is manufacturable at a lower cost. In this second embodiment, each thickness of the Ti and Pd films can be controlled by a combination of the sputtering power and the on-time duration. FIG. 6 (a) and (b) show the waveforms of powers applied respectively to the first and second targets (electrodes) 3 and 6. In this case, the intermittent sputtering controller 5 may include a pulse generator which produces its combined output pulses of the periods shown in FIG. 6 (a) and (b). It is also permitted to use, for the same purpose, two pulse generators capable of producing output pulses of such two periods or the MPU employed in FIG. 3.

Now a description will be given on the temperature rise caused on the film-forming substrate during the operation of the present invention.

In forming an aluminum film by the intermittent sputtering apparatus, it has been found that, as graphically shown in FIG. 7, the substrate increase of temperature to the completion of a desired film thickness is low. The substrate temperature was measured with a CA thermocouple fixed to the reverse surface of the substrate by the use of heat-resistant resin. The result signifies that a long time is required for completing a desired film thickness because the substrate is cooled in the idle mode where the sputtering power level is low and consequently the temperature rise is suppressed. And the particle size in the film thus formed is smaller than the size obtained by the conventional sputtering method.

A third embodiment of the invention will now be described below.

In the second embodiment (FIG. 5), a single power source serves to supply both a high-level target power and a low-level target power (idle power). However, such function can be divided as in the embodiment disclosed in FIG. 8. In this structure, there are employed, in combination, a main power source 41 for producing a high-level target power and subsidiary power as an output sources 42 for producing a low-level as an output. The use of such subsidiary power sources 42 simplifies the function of the intermittent sputtering controller 5.

The main power source 41, the subsidiary power sources 42 and the targets are connected to one another by means of an electrode selector switch 81 and a low power changeover switch 82. When a high-level power is applied to the first target (electrode) 3, the main power source 41 is connected to the target 3 by controlling the switch 81 in the intermittent sputtering controller 5, while the subsidiary power source 42 is disconnected from the target 3 by controlling the switch 82. And when a high-level power is applied to the second target (electrode) 6, the main power source 41 is connected to the second target 6 via the switches 81 and 82.

In this manner, the main power source 41 is connected sequentially to the multiple targets (electrodes) 3, 6 and 7. Meanwhile the subsidiary power sources 42 are connected to the other targets which are not connected to the main power source 41, thereby holding the sputtering plasma.

Thus, differing from the conventional apparatus where a large main power source 41 is required for each of the entire targets, this embodiment is equipped merely with a single main power source 41 and a plurality of small subsidiary power sources 42, hence reducing both the cost of the power sources and the installation area thereof.

Figure 8:
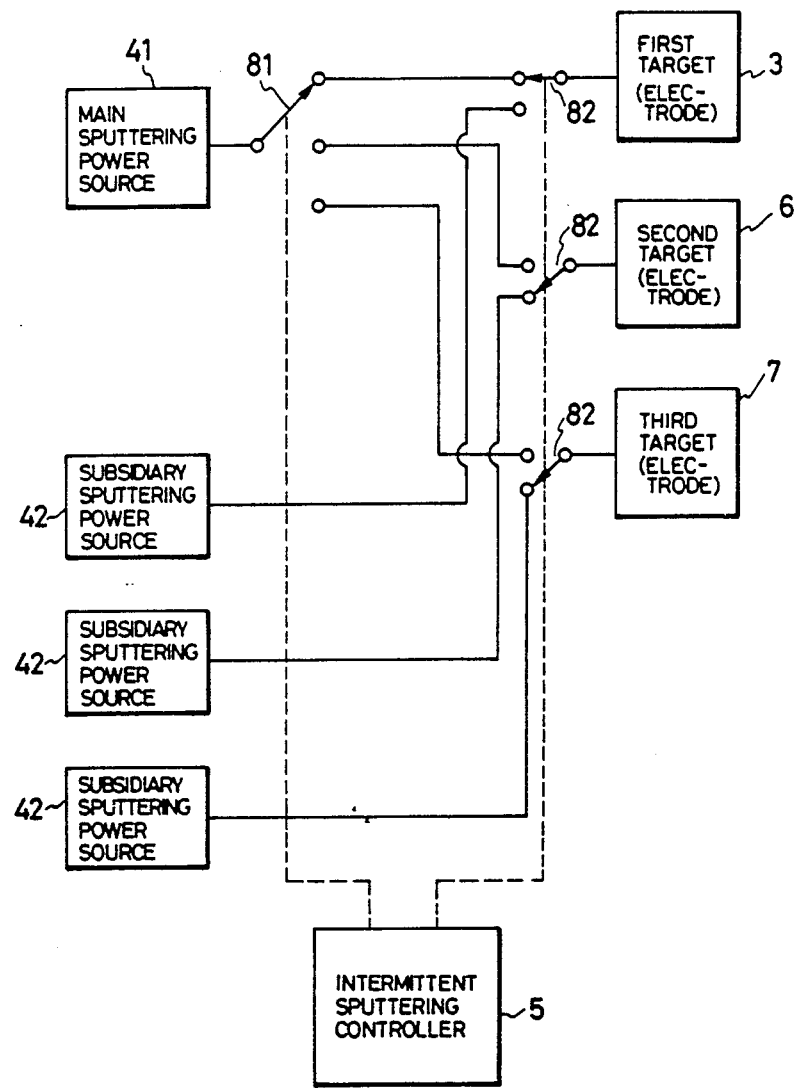
FIG. 8 illustrates the entire constitution of a third embodiment representing the intermittent sputtering apparatus of the present invention.

In this third embodiment of FIG. 8 also, as in the foregoing embodiments of FIGS. 1 and 5, the intermittent sputtering controller 5 may be composed of a pulse generator or a micro computer shown in FIG. 3. Furthermore, each of the switches 81 and 82 may be composed of a relay circuit which is driven by the pulses that are the outputs of controller 5. Since such constitution can be realized with facility by using the known art, a specific explanation thereof is omitted here.

According to the present invention, as mentioned hereinabove, multilayer films of mutually different film thickness ratios can be formed by the use of standard-size targets, and still a desired film quality can be ensured with regard to each film. And when the sputtering power is in excess, it is allocated to the other targets to consequently enable supply of the power from a single power source to a multiplicity of targets. Since the number of required power sources can thus be reduced, the sputtering apparatus is rendered advantageous for practical use.

What is claimed is:

1. A sputtering method for forming a film by using a plurality of targets wherein a period for producing the film is controlled, comprising the steps of:
   changing a power output of a sputtering power source, setting the output to a high level so as to deposit the film of a predetermined quality and setting the output to a low level to maintain a predetermined minimum plasma around a target;
   applying said power output of said sputtering power source to one of said plurality of targets; and
   depositing said film to a thickness corresponding to an integrated value of the sputtering power supplied to said one of said plurality of targets during a production period.

2. A sputtering method according to claim 1, further comprising a step of connecting the output of said sputtering power source to a plurality of sputtering electrodes associated with said plurality of targets; and periodically energizing said sputtering electrodes in sequence.

3. A sputtering method according to claim 1, wherein said sputtering power source includes a main sputtering power source having a high level power output and a subsidiary sputtering power source having a low level power output, and wherein said method further comprises the step of periodically connecting the output of said main sputtering power source to one of said sputtering electrodes through a first switch, and connecting said subsidiary sputtering power source to a sputtering electrode not connected to said main sputtering power source via a second switch.

4. The sputtering method of claim 1, wherein said predetermined quality is defined by a particle size of the film.

5. The sputtering method of claim 1 wherein said predetermined quality is defined by an adhesion strength of the film.

6. The sputtering method of claim 1 wherein said step of depositing includes forming each layer with one of said targets.

7. A sputtering apparatus comprising:
   a substrate transported at a predetermined speed;
   a plurality of targets disposed along the transport path of said substrate and serving to form films on said substrate by sputtering;
   a plurality of sputtering power sources provided correspondingly to said targets; and
   a control means, connected to at least one of said sputtering power sources, for controlling the power output of said at least one sputtering power source, said control means including first means for periodically producing a high level power output and a low level power output, said high level power output being high enough to deposit a film of a predetermined quality, said low level power output being high enough to maintain a predetermined minimum plasma around said targets.

8. A sputtering apparatus according to claim 7, wherein said control means comprises a pulse generator.

9. A sputtering apparatus according to claim 7, wherein said control means comprises an input means for receiving sputtering condition parameters, and a means for arithmetically controlling the sputtering power on the basis of the conditions received by said input means.

10. A sputtering apparatus comprising:
    a substrate transported at a predetermined speed;
    a plurality of targets disposed along the transport path of said substrate and serving to form films on said substrate by sputtering;
    a sputtering power source connected in common to two or more of said targets; and
    a means, connected to said sputtering power source and, for controlling said sputtering power source, periodically allocating and supplying a high level power output to said targets to deposit the film of a predetermined quality and a low level power output to said targets to maintain a predetermined minimum plasma around the targets.

11. A sputtering apparatus comprising:
    a plurality of targets for forming films by sputtering;

a first sputtering source having a high level power output of a level for depositing the film of a predetermined quality;

a second sputtering power source having a low level power output of a level for maintaining a predetermined minimum plasma around the targets;

a first connection means for connecting said first sputtering power source to one of said targets;

a second connection means for connecting said second sputtering power source to one of said targets; and a control means for controlling said first and second connection means periodically.

* * * * *

UNITED STATES PATENT AND TRADEMARK OFFICE
CERTIFICATE OF CORRECTION

PATENT NO. : 4,902,394
DATED : 20 February 1990
INVENTOR(S) : Akihiro KENMOTSU et al.

It is certified that error appears in the above-identified patent and that said Letters Patent is hereby corrected as shown below:

| Column | Line | |
|---|---|---|
| 1 | 38 | Change "in-linen" to --in-line--. |
| 4 | 1 | After "output" insert --of--. |
| 4 | 45 | After "periods" insert --,--. |
| 4 | 52 | Change "substrate increase of" to --increase of substrate--. |
| 5 | 3 | After "power" insert --as an output-- |
| 5 | 4 | After "power" delete "as an output"; after "low-level" insert --power--. |
| 6 | 2 | change "a" to --the--. |

Signed and Sealed this

Sixth Day of August, 1991

*Attest:*

HARRY F. MANBECK, JR.

*Attesting Officer*  *Commissioner of Patents and Trademarks*